(12) United States Patent
Doan et al.

(10) Patent No.: US 6,743,724 B2
(45) Date of Patent: *Jun. 1, 2004

(54) PLANARIZATION PROCESS FOR SEMICONDUCTOR SUBSTRATES

(75) Inventors: Trung T. Doan, Boise, ID (US); Guy T. Blalock, Boise, ID (US); Mark Durcan, Boise, ID (US); Scott G. Meikle, Boise, ID (US)

(73) Assignee: Micron Technology, Inc., Boise, ID (US)

(*) Notice: Subject to any disclaimer, the term of this patent is extended or adjusted under 35 U.S.C. 154(b) by 213 days.

This patent is subject to a terminal disclaimer.

(21) Appl. No.: 09/832,560

(22) Filed: Apr. 11, 2001

(65) Prior Publication Data

US 2001/0051430 A1 Dec. 13, 2001

Related U.S. Application Data

(63) Continuation of application No. 08/862,752, filed on May 23, 1997, now Pat. No. 6,331,488.

(51) Int. Cl.$^7$ .............................................. H01L 21/302
(52) U.S. Cl. ....................... 438/692; 438/698; 438/705; 438/760; 216/87; 216/88
(58) Field of Search ................................ 438/698, 705, 438/760, 692; 427/277, 278, 370; 216/87, 88

(56) References Cited

U.S. PATENT DOCUMENTS

| | | |
|---|---|---|
| 1,777,310 A | 10/1930 | Hopkinson |
| 2,373,770 A | 4/1945 | Martin |
| 2,431,943 A | 12/1947 | Land et al. |
| 3,120,205 A | 2/1964 | Pfeiffer et al. |
| 3,135,998 A | 6/1964 | Fowler et al. |
| 3,850,559 A | 11/1974 | Mintz et al. |
| 4,234,373 A | 11/1980 | Reavill et al. |
| 4,476,780 A | 10/1984 | Bunch |
| 4,700,474 A | 10/1987 | Choinski |
| 4,734,155 A | 3/1988 | Tsunoda et al. |
| 4,806,195 A | 2/1989 | Namysl |

(List continued on next page.)

FOREIGN PATENT DOCUMENTS

| | | |
|---|---|---|
| EP | 285245 A1 | 10/1988 |
| EP | 683511 A3 | 11/1995 |
| EP | 683511 A2 | 11/1995 |
| EP | 731503 A2 | 9/1996 |
| GB | 998210 | 7/1965 |
| WO | 90/12683 | 11/1990 |

OTHER PUBLICATIONS

Supplementary European Search Report, dated Feb. 17, 2000.
Notification of Transmittal of the International Search Report or the Declarations, dated Oct. 2, 1998.
Exhibit A, 2 pages.
Cameron et al., "Photogeneration of Organic Bases from o–Nitrobenzyl–Derived Carbamates," J. Am. Chem. Soc., 1991, 113, pp. 4303–4313.
Cameron et al., "Base Catalysis in Imaging Materials," J. Org. Chem., 1990, 55, pp. 5919–5922.

(List continued on next page.)

*Primary Examiner*—George Goudreau
(74) *Attorney, Agent, or Firm*—TraskBritt

(57) ABSTRACT

A method of manufacturing semiconductor devices using an improved chemical mechanical planarization process for the planarization of the surfaces of the wafer on which the semiconductor devices are formed. The improved chemical mechanical planarization process includes the formation of a flat planar surface from a deformable coating on the surface of the wafer filling in between the surface irregularities prior to the planarization of the surface through a chemical mechanical planarization process.

45 Claims, 10 Drawing Sheets

U.S. PATENT DOCUMENTS

| | | | |
|---|---|---|---|
| 4,810,672 A | 3/1989 | Schwarzbauer | |
| 5,049,232 A | 9/1991 | Tola | |
| 5,078,820 A | 1/1992 | Hamamura et al. | |
| 5,122,848 A | 6/1992 | Lee et al. | |
| 5,124,780 A | 6/1992 | Sandhu et al. | |
| 5,205,770 A | 4/1993 | Lowrey et al. | |
| 5,232,875 A | 8/1993 | Tuttle et al. | |
| 5,238,862 A | 8/1993 | Blalock et al. | |
| 5,250,450 A | 10/1993 | Lee et al. | |
| 5,261,997 A | 11/1993 | Inselmann | |
| 5,286,329 A | 2/1994 | Iijima et al. | |
| 5,300,155 A | 4/1994 | Sandhu et al. | |
| 5,300,801 A | 4/1994 | Blalock et al. | |
| 5,302,233 A | 4/1994 | Kim et al. | |
| 5,302,343 A | 4/1994 | Jacob | |
| 5,312,512 A | 5/1994 | Allman et al. | |
| 5,314,843 A | 5/1994 | Yu et al. | |
| 5,434,107 A | 7/1995 | Paranjpe | |
| 5,492,858 A | 2/1996 | Bose et al. | |
| 5,516,729 A | 5/1996 | Dawson et al. | |
| 5,533,924 A | 7/1996 | Stroupe et al. | |
| 5,554,065 A | 9/1996 | Clover | |
| 5,558,015 A | 9/1996 | Miyashita et al. | |
| 5,569,062 A | 10/1996 | Karlsrud | |
| 5,575,707 A | 11/1996 | Talieh et al. | |
| 5,618,381 A | 4/1997 | Doan et al. | |
| 5,624,299 A | 4/1997 | Shendon | |
| 5,624,300 A | 4/1997 | Kishii et al. | |
| 5,624,303 A | 4/1997 | Robinson | |
| 5,624,304 A | 4/1997 | Pasch et al. | |
| 5,629,242 A | 5/1997 | Nagashima et al. | |
| 5,639,697 A | 6/1997 | Weling et al. | |
| 5,643,046 A | 7/1997 | Katakabe et al. | |
| 5,643,050 A | 7/1997 | Chen | |
| 5,643,406 A | 7/1997 | Shimomura et al. | |
| 5,643,837 A | 7/1997 | Hayashi | |
| 5,650,261 A | 7/1997 | Winkle | |
| 5,679,610 A | 10/1997 | Matsuda et al. | |
| 5,691,100 A | 11/1997 | Kudo et al. | |
| 5,700,890 A | 12/1997 | Chou | |
| 5,736,424 A | 4/1998 | Prybyla et al. | |
| 5,967,030 A | 10/1999 | Blalock | |
| 6,062,133 A | 5/2000 | Blalock | |
| 6,218,316 B1 | 4/2001 | Marsh | |
| 6,316,363 B1 | 11/2001 | Blalock et al. | |
| 6,331,488 B1 | 12/2001 | Doan et al. | |
| 6,403,499 B2 | 6/2002 | Marsh | |
| 6,420,214 B1 * | 7/2002 | Brooks et al. | 438/127 |
| 6,506,679 B2 | 1/2003 | Blalock et al. | |
| 6,518,172 B1 | 2/2003 | Blalock et al. | |

OTHER PUBLICATIONS

Allen et al., "Photoresists for 193–nm Lithography," IBM J. Res. Develop., vol. 41, No. ½, Jan.–Mar. 1997, pp. 95–104.

Seeger et al., "Thin–Film Imaging: Past, Present, Prognosis," IBM J. Res. Develop., vol. 41, No. ½, Jan–Mar. 1997, pp. 105–118.

Shaw et al., "Negative Photoresists for Optical Lithography," IBM J. Res. Develop., vol. 41, No. ½, Jan.–Mar. 1997, pp. 81–94.

Ito, H., "Chemical Amplification Resists: History and Development Within IBM," IBM J. Res. Develop., vol. 41, No. ½, Jan.–Mar. 1997, pp. 69–80.

Rothschild et al., "Lithography at a Wavelength of 193 nm," IBM J. Res. Develop., vol. 41, No. ½, Jan.–Mar. 1997, pp. 49–55.

H. Yoshino et al., Photoacid Structure Effects on Environmental Stability of 193–nm Chemically Amplified Positive Resists. IEEE, pp. 76–77.

H. Guckel et al., Deep X–Ray and UV Lithographies for Micromechanics. 1990 IEEE, pp. 118–122.

L.A. Pederson Sr. et al., Characterization of a Photoresist with Wavelength Selected Tone. 1990 IEEE, pp. 1828–1835.

J.E. Bousaba et al., Plasma Resistant Modified I–Line, Deep UV, and E–Beam Resists. 1995 IEEE, pp. 195–200.

* cited by examiner

PLANARIZATION PROCESS FOR SEMICONDUCTOR SUBSTRATES

CROSS REFERENCE TO RELATED APPLICATION

This application is a continuation of application Ser. No. 08/862,752, filed May 23, 1997, now U.S. Patent 6,331,488, issued Dec. 18, 2001.

BACKGROUND OF THE INVENTION

Field of the Invention:

The present invention relates to the manufacturing of semiconductor devices. More particularly, the present invention relates to an improved chemical mechanical planarization process for the planarization of surfaces in the manufacturing of semiconductor devices.

State of the Art: Typically, integrated circuits are manufactured by the deposition of layers of predetermined materials to form the desired circuit components on a silicon wafer semiconductor substrate. As the layers are deposited on the substrate wafer to form the desired circuit component, the planarity of each of the layers is an important consideration because the deposition of each layer produces a rough, or nonplanar topography initially on the surface of the wafer substrate and, subsequently, on any previously deposited layer of material.

Typically, photolithographic processes are used to form the desired circuit components on the wafer substrate. When such photolithographic processes are pushed to their technological limits of circuit formation, the surface on which the processes are used must be as planar as possible to ensure success in circuit formation. This results from the requirement that the electromagnetic radiation used to create a mask, which is used in the formation of the circuits of the semiconductor devices in wafer form, must be accurately focused at a single level, resulting in the precise imaging over the entire surface of the wafer. If the wafer surface is not sufficiently planar, the resulting mask will be poorly defined, causing, in turn, a poorly defined circuit which may malfunction. Since several different masks are used to form the different layers of circuits of the semiconductor devices on the substrate wafer, any nonplanar areas of the wafer will be subsequently magnified in later deposited layers.

After layer formation on the wafer substrate, either a chemical etch-back process of planarization, or a global press planarization process typically followed by a chemical etch-back process of planarization, or chemical mechanical planarization process may be used to planarize the layers before the subsequent deposition of a layer of material thereover. In this manner, the surface irregularities of a layer may be minimized so that subsequent layers deposited thereon do not substantially reflect the irregularities of the underlying layer.

One type of chemical etch-back process of planarization, illustrated in EUROPEAN PATENT APPLICATION 0 683 511 A2, uses a coating technique in which an object having a flat surface is used to planarize a coating material applied to the wafer surface prior to a plasma reactive ion etching process being used to planarize the wafer surface. Often, however, the planarization surface will contain defects, such as pits or other surface irregularities. These may result from defects in the flat surface used for planarizing or from foreign material adhering to the flat surface. The etching of such a wafer surface having irregularities will, at best, translate those undesirable irregularities to the etched surface. Further, since some etching processes may not be fully anisotropic, etching such irregular surfaces may increase the size of the defects in the etched wafer surface.

One type of global press planarization process, illustrated in U.S. Pat. No. 5,434,107, subjects a wafer with features formed thereon having been coated with an inter-level dielectric material to an elevated temperature while an elevated pressure is applied to the wafer using a press until the temperature and pressure conditions exceed the yield stress of the upper film on the wafer so that the film will attempt to be displaced into and fill both the microscopic and local depressions in the wafer surface. It should be noted that the film is only deformed locally on the wafer, not globally, during the application of elevated temperature and pressure since the object contacting the surface of the wafer will only contact the highest points or areas on the surface of the wafer to deform or displace such points or areas of material on the entire wafer surface. Other nonlocal depressions existing in the wafer are not affected by the pressing as sufficient material is not displaced thereinto. Subsequently, the temperature and pressure are reduced so that the film will become firm again thereby leaving localized areas having a partially planar upper surface on portions of the wafer while other portions of the wafer surface will remain nonplanar.

In one instance, global planar surfaces are created on a semiconductor wafer using a press located in a chamber. Referring to drawing FIG. 1, a global planarization apparatus 100 is illustrated. The global planarization apparatus 100 serves to press the surface of a semiconductor wafer 120 having multiple layers including a deformable outermost layer 122 against a fixed pressing surface 132. The surface of the deformable layer 122 will assume the shape and surface characteristics of the pressing surface 132 under the application of force to the wafer 120. The global planarization apparatus 100 includes a fully enclosed apparatus having a hollow cylindrical chamber body and having open top and bottom ends 113 and 114, respectively, and interior surface 116 and an evacuation port 111. A base plate 118 having an inner surface 117 is attached to the bottom end 114 of chamber body 112 by bolts 194. A press plate 130 is removably mounted to the top end 113 of chamber body 112 with pressing surface 132 facing base plate 118. The interior surface 116 of chamber body 112, the pressing surface 132 of press plate 130 and the inner surface 117 of base plate 118 define a sealable chamber. Evacuation port 111 can be positioned through any surface, such as through base plate 118, and not solely through chamber body 112.

The press plate 130 has a pressing surface 132 with dimensions greater than that of wafer 120 and being thick enough to withstand applied pressure. Press plate 130 is formed from nonadhering material capable of being highly polished so that pressing surface 132 will impart the desired smooth and flat surface quality to the surface of the deformable layer 122 on wafer 120. Preferably, the press plate is a disc shaped quartz optical flat.

A rigid plate 150 having top and bottom surfaces 152 and 154, respectively, and lift pin penetrations 156 therethrough is disposed within chamber body 112 with the top surface 152 substantially parallel to and facing the pressing surface 132. The rigid plate 150 is constructed of rigid material to transfer a load under an applied force with minimal deformation.

A uniform force is applied to the bottom surface 154 of rigid plate 150 through the use of a bellows arrangement 140 and relatively pressurized gas to drive rigid plate 150 toward pressing surface 132. Relative pressure can be achieved by supplying gas under pressure or, if the chamber body 112 is under vacuum, allowing atmospheric pressure into bellows arrangement 140 to drive the same. The bellows arrangement 140 is attached at one end to the bottom surface 154 of rigid plate 150 and to the inner surface 117 of base plate 118 with a bolted mounting plate 115 to form a pressure containment that is relatively pressurized through port 119 in base plate 118. One or more brackets 142 are mounted to the inner surface 117 of the base plate 118 to limit the motion toward base plate 118 of the rigid plate 150 when bellows arrangement 140 is not relatively pressurized. The application of force through the use of a relatively pressurized gas ensures the uniform application of force to the bottom surface 154 of rigid plate 150. The use of rigid plate 150 will serve to propagate the uniform pressure field with minimal distortion. Alternately, the bellows arrangement 140 can be replaced by any suitable means for delivering a uniform force, such as a hydraulic means.

A flexible pressing member 160 is provided having upper and lower surfaces 162 and 164, respectively, which are substantially parallel to the top surface 152 of rigid plate 150 and pressing surface 132. Lift pin penetrations 166 are provided through flexible pressing member 160. The flexible pressing member 160 is positioned with its lower surface 164 in contact with the top surface 152 of rigid plate 150 and lift pin penetrations 166 aligned with lift pin penetrations 156 in rigid plate 150. The upper surface 162 of the flexible pressing member 160 is formed from a material having a low viscosity that will deform under an applied force to close lift pin penetrations 166 and uniformly distribute the applied force to the wafer, even when the top surface 152, the upper surface 162 and/or the lower surface 164 is not completely parallel to the pressing surface 132 or when thickness variations exist in the wafer 120, rigid plate 150 or flexible pressing member 160, as well as any other source of nonuniform applied force.

Lift pins 170 are slidably disposable through lift pin penetrations 156 and 166, respectively, in the form of apertures, to contact the bottom surface 126 of wafer 120 for lifting the wafer 120 off the top surface 162 of flexible pressing member 160. Movement of the lift pins 170 is controlled by lift pin drive assembly 172, which is mounted on the inner surface 117 of the base plate 118. The lift pin drive assembly provides control of the lift pins 170 through conventional means. Lift pins 170 and lift pin drive assembly 172 are preferably positioned outside the pressure boundary defined by the bellows arrangement 140 to minimize the number of pressure boundary penetrations. However, they can be located within the pressure boundary, if desired, in a suitable manner.

A multi-piece assembly consisting of lower lid 180, middle lid 182, top lid 184, gasket 186 and top clamp ring 188 are used to secure the press plate 130 to the top end 113 of chamber body 112. The ring-shaped lower lid 180 is mounted to the top end 113 of chamber body 112 and has a portion with an inner ring dimension smaller than press plate 130 so that press plate 130 is seated on lower lid 180. Middle lid 182 and top lid 184 are ring-shaped members having an inner ring dimension greater than press plate 130 and are disposed around press plate 130. Middle lid 182 is located between lower lid 180 and top lid 184. A gasket 186 and top clamp ring 188 are members having an inner ring dimension less than that of press plate 130 and are seated on the surface of press plate 130 external to the chamber. Bolts 194 secure press plate 130 to the chamber body 112.

Heating elements 190 and thermocouples 192 control the temperature of the member 160.

In operation, the top clamp ring 188, gasket 186, top lid 184, and middle lid 182 are removed from the body 112 and the press plate 130 lifted from lower lid 180. The bellows arrangement 140 is deflated and rigid plate 150 is seated on stand off brackets 142. The wafer 120 is placed on the flexible pressing member 160 with the side of the wafer 120 opposite the deformable layer 122 in contact with flexible pressing member 160. The press plate 130 is mounted on the lower lid 180 and the middle lid 182 and upper lid 184 are installed and tightened using gasket 186 and top clamp ring 188 sealing press plate 130 between top clamp ring 188 and lower lid 180. The temperature of flexible pressing member 160, press plate 130, and rigid plate 150 are adjusted through the use of heating elements 190 monitored by thermocouples 192 to vary the deformation characteristics of the deformaable layer 122 of wafer 120. Chamber body 112 is evacuated through port 119 to a desired pressure.

A pressure differential is established between the interior and exterior of the bellows arrangement 140, whether by pressurizing or by venting when the chamber body 112 having been evacuated thereby drives rigid plate 150, flexible pressing member 160, and wafer 120 toward press plate 130 and brings deformable layer 122 of wafer 120 into engagement with pressing surface 132 of press plate 130. Upon engagement of wafer 120 with press plate 130, the continued application of force will deform the flexible pressing member 160 which, in turn, serves to close lift pin penetrations 166 and distribute the force to ensure the wafer 120 experiences uniform pressure on its deformable layer 122. After the wafer 120 has been in engagement with pressing surface 132 for a sufficient time to cause deformable layer 122 to globally correspond to the pressing surface 132, the deformable layer 122 is hardened or cured. The pressure is released from the bellows arrangement 140, thereby retracting wafer 120, flexible pressing member 160, and rigid plate 150 from the press plate 130. The downward movement of rigid plate 150 will be terminated by its engagement with stand off offset brackets 142.

Once the rigid plate 150 is fully retracted, the vacuum is released in chamber body 112. Lift pins 170 are moved through lift pin penetrations 156 in the rigid plate 150 and lift pin penetrations 166 in the flexible pressing member 160 to lift wafer 120 off the flexible pressing member 160. The top clamp ring 188, gasket 186, top lid 184, middle lid 182, and press plate 130 are removed and the wafer 120 is removed off lift pins 170 for further processing.

Once the wafer is removed, it will be subjected to an etch to establish the planar surface at the desired depth. A system used or depicted in FIG. 1 provides an optimal method of deforming a flowable, curable material to form a generally planarized surface. However, the method is still subject to yielding a wafer surface with irregularities therein, and the need for the subsequent etch to define the desired surface height will still result in undesirable transfer and possible enlargement of any such surface irregularities.

Conventional chemical mechanical planarization processes are used to planarize layers formed on wafer substrates in the manufacture of integrated circuit semiconductor devices. Typically, a chemical mechanical planarization (CMP) process planarizes a nonplanar irregular surface of a wafer by pressing the wafer against a moving polishing surface that is wetted with a chemically reactive, abrasive slurry. The slurry is usually either basic or acidic and generally contains alumina or silica abrasive particles. The polishing surface is usually a planar pad made of a relatively soft, porous material, such as a blown polyurethane, mounted on a planar platen.

Referring to drawing FIG. 2, a conventional chemical mechanical planarization apparatus is schematically illustrated. A semiconductor wafer 1112 is held by a wafer carrier 1111. A soft, resilient pad 1113 is positioned between the wafer carrier 1111 and the wafer 1112. The wafer 1112 is held against the pad 1113 by a partial vacuum. The wafer carrier 1111 is continuously rotated by a drive motor 1114 and is also designed for transverse movement as indicated by the arrows 1115. The rotational and transverse movement is intended to reduce variability in material removal rates over the surface of the wafer 1112. The apparatus further comprises a rotating platen 1116 on which is mounted a polishing pad 1117. The platen 1116 is relatively large in comparison to the wafer 1112, so that during the chemical mechanical planarization process, the wafer 1112 may be moved across the surface of the polishing pad 1117 by the wafer carrier 1111. A polishing slurry containing a chemically reactive solution, in which abrasive particles are suspended, is delivered through a supply tube 1121 onto the surface of the polishing pad 1117.

Referring to drawing FIG. 3 a typical polishing table is illustrated in top view. The surface of the polishing table 1 is precision machined to be flat and may have a polishing pad affixed thereto. The surface of the table rotates the polishing pad past one or more wafers 3 to be polished. The wafer 3 is held by a wafer holder, as illustrated hereinbefore, which exerts vertical pressure on the wafer against the polishing pad. The wafer holder may also rotate and/or orbit the wafer on the table during wafer polishing.

Alternately, the table 1 may be stationary and serve as a supporting surface for individual polishing platens 2, each having their own individual polishing pad. As illustrated in U.S. Pat. No. 5,232,875, each platen may have its own mechanism for rotating or orbiting the platen 2. A wafer holder will bring a wafer in contact with the platen 2 and an internal or external mechanism to the wafer holder may be used to also rotate the wafer during the polishing operation. In a polishing table having multiple individual platens, each platen must be precision machined.

The wafers 3 are typically stored and transported in wafer cassettes which hold multiple wafers. The wafers 3 or wafer holders are transported between the wafer cassettes and the polishing table 1 using the wafer transport arm 4. The wafer transport arm 4 will transport the wafers 3 between the polishing table and the stations 5, which may be wafer cassette stations or wafer monitoring stations.

The polishing characteristics of the polishing pad will change during use as multiple wafers 3 are polished. The glazing or changing of the polishing characteristics will affect the planarization of the surface of the wafers 3 if the pads are not periodically conditioned and unglazed. The pad conditioner 6 is used to periodically unglaze the surface of the polishing pad. The pad conditioner 6 has a range of motion which allows it to come in contact with the individual pads and conduct the periodic unglazing and then to move to its rest position.

The pressure between the surface of the wafer to be polished and the moving polishing pad may be generated by either the force of gravity acting on the wafer and the wafer carrier or by mechanical force applied normal to the wafer surface. The slurry may be delivered or injected through the polishing pad onto its surface. The planar platens may be moved in a plane parallel to the pad surface with either an orbital, fixed-direction vibratory or random direction vibratory motion.

While a chemical mechanical planarization process is an effective process to planarize the surface of a wafer, variations in height on the surface to be planarized by the chemical mechanical planarization process, although minimized through the chemical mechanical planarization process, will often not be completely removed to yield an optimally planar surface. As is well known in the art, the chemical mechanical planarization process polishing pad will deform, or "dish", into recesses between structures of the surface of the wafer. The structure spacing on the wafer which will yield this "dishing" is clearly a function of various factors, such as the pad composition, the polishing pressure, etc. This pad "dishing" will clearly lead to less than optimal planarization of the surface of the wafer. Further, the surface irregularities extending into or down to the wafer surface being planarized tend to collect slurry, thereby causing such areas of the wafer to be subjected to the corrosive effects of the slurry longer than other areas of the wafer surface which do not collect the slurry.

To help minimize polishing pad deformation (dishing) caused by surface irregularities formed by the integrated circuit components on the wafer surface, dummy structures have also been included on the wafer surface in an attempt to provide a more uniform spacing of structures on the wafer surface. While the use of such dummy structures will often be useful, the ultimate result is also highly dependent upon the later chemical mechanical planarization process conditions.

Therefore, a need exists to reduce the surface irregularities on a wafer before the chemical mechanical planarization process to facilitate planarization of the wafer surface irregularities by such process and to facilitate planarization which provides greater latitude in the chemical mechanical planarization process parameters.

SUMMARY OF THE INVENTION

The present invention relates to an improved chemical mechanical planarization process for the planarization of surfaces in the manufacturing of semiconductor devices. The improved chemical mechanical planarization process of the present invention includes the formation of a flat, planar surface from a deformable, planar coating on the surface of the wafer filling the areas between the surface irregularities prior to the planarization of the surface through a chemical mechanical planarization process.

DETAILED DESCRIPTION OF THE INVENTION

Figure 4:
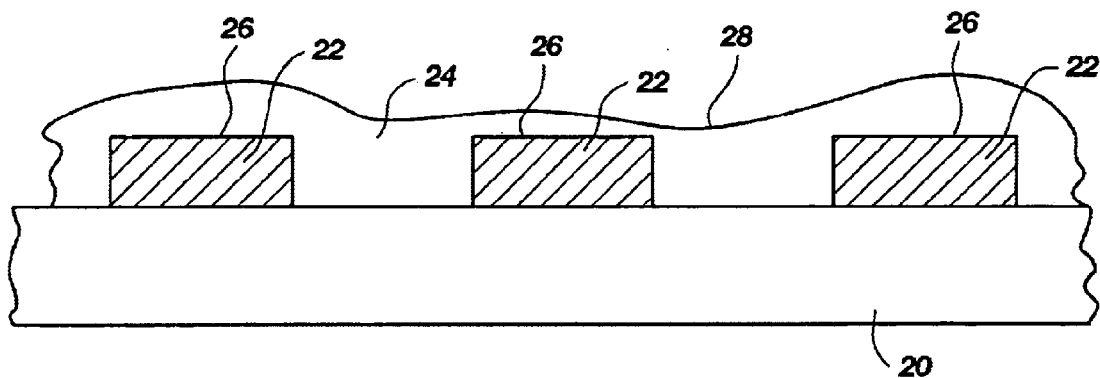
FIG. 4 is a cross-sectional view of a portion of a wafer substrate having electrical circuit components formed thereon with a coating thereover.

Referring to drawing FIG. 4, a portion of a wafer substrate 20 is illustrated having portions of electrical circuit components 22 formed thereon and a coating of material 24, typically a metallic material, a semiconductor material, or an insulating material 24, covering the electrical circuit components 22 and portions of the wafer substrate 20 located between the electrical circuit components 22. As illustrated, the portions of the electrical circuit components 22 are formed having upper surfaces 26 thereon while the coating of insulating material 24 is formed having an irregular nonplanar surface 28 extending over the upper surfaces 26 of the electrical circuit components 22. The insulating material 24 typically comprises an insulating oxide or other dielectric material and may include a plurality of layers of such insulating or other types of material, as desired. In this instance, for convenience, the insulating material 24 is illustrated covering the wafer substrate 20 and the electrical circuit components 22 thereon regardless of the number of layers thereof It can be easily seen that if only portions of the nonplanar surface 28 of insulating material 24 are removed for the formation of additional electrical circuit components, the nonplanar surface of the insulating material 24 would cause masking and etching problems as the masking of the insulating material 24 as well as the etching thereof would not be uniform. Therefore, the nonplanar surface 28 must be globally planarized to facilitate further electrical circuit component formation.

At this juncture, if a conventional chemical mechanical planarization process is used on the wafer substrate 20, the surface of the wafer will be subject to a reactive slurry and one or more polishing pads used in the process in an attempt to form a planar surface on the insulating material 24 covering the electrical circuit components 22. Some of the problems associated with such a conventional chemical mechanical planarization process are that the reactive slurry is unevenly distributed about the wafer substrate 20 and the pad used in the process, that particulates removed from the wafer substrate 20 and insulating material 24 during the polishing process may become lodged in the polishing pad, forming a glaze thereon, thereby affecting the rate of removal by the pad and causing the polishing pad to unevenly remove material during the process, and that as the chemical mechanical planarization process begins by polishing an irregular surface on the wafer, such surface causes the deformation of the polishing pad (dishing), thereby further inducing irregularities not initially present in the surface being polished, the induced irregularities of the surface of the wafer during the chemical mechanical planarization of the wafer surface being caused by the dishing of the polishing pad from the force applied thereto and the deformation of the pad by surface areas of the wafer. Therefore, before starting the chemical mechanical planarization process of the surface of a wafer, it is desirable to have the surface to be planarized as nearly planar as possible to help ensure the even removal of material therefrom and to help eliminate the deformation of the polishing pad(s) being used to thereby, in turn, help minimize any surface irregularities being introduced into the surface being planarized by such pad deformation.

Figure 5:
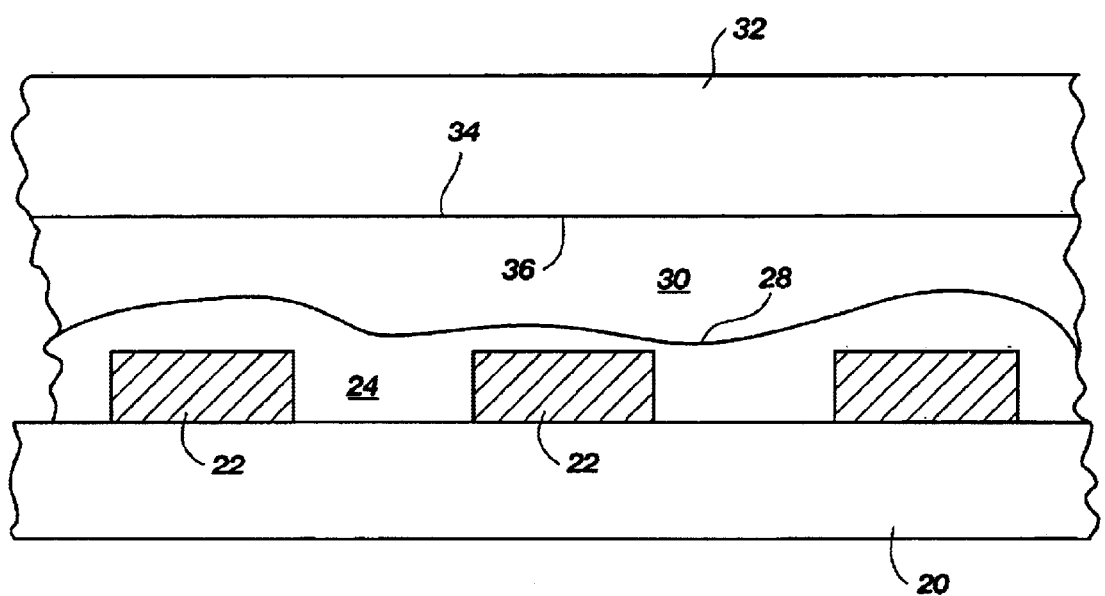
FIG. 5 is a cross-sectional view of a portion of a wafer substrate having electrical circuit components formed thereon, a coating thereover, a deformable coating, and a portion of a flat pressing member used in the present invention.

Referring to drawing FIG. 5, the improved chemical mechanical planarization process of the present invention is illustrated in relation to a wafer substrate 20 having electrical circuit components 22 thereon and a coating of insulating material 24 thereover. In the improved chemical mechanical planarization process of the present invention, prior to the initiation of the chemical mechanical planarization of the wafer substrate 20, electrical circuit components 22 and insulating material 24, a layer of deformable material 30 is coated or deposited over the insulating material 24. The deformable material 30 may be of any suitable type material that readily flows over the nonplanar surface 28 of the insulating material 24 and that is subsequently solidified through curing or hardening or other type of solidification. Alternately, the deformable material 30, in some instances, may be a readily deformable metal capable of being deformed under low temperature and low pressure which may be readily deposited over the insulating material 24 through well known techniques and processes. Whatever the type of deformable material 30, the deformable material 30 is applied over the insulating material 24 to any desired depth but is typically applied in a thickness greater than the thickness of the surface topography of the wafer, the thickness of the deformable material 30 initially applied to the wafer depending upon the type of material selected for such use, the dimensions of the surface irregularities, etc. After the application of the layer of deformable material 30 to the insulating material 24 and before the deformable material 30 has cured, hardened, or solidified to the point which it is not capable of being deformed, an object 32 having a flat planar surface 34 thereon is forced under pressure into the deformable material 30 to form a flat, planar surface 36 thereon and is kept in contact with the deformable material 30 while the deformable material 30 cures, hardens, or solidifies. The object 32 may be of any well known suitable material, such as an optical quartz glass disc shaped object, having a desired flat, planar ground surface thereon which may be used to be pressed into the deformable material 30 to form a flat, planar surface 36 thereon. If desired, the object 32 may be tailored to meet process requirements of the desired range of pressure to be applied to the deformable material 30 and the method of curing, hardening or solidifying the deformable material 30. Further, if desired, the flat, planar surface 34 on the object 32 may have a shape other than a flat, planar surface 34, such as either a concave surface, convex surface, concave and convex surface, or any type desired surface suitable in a chemical mechanical planarization process. Additionally, the flat, planar surface 34 of the object 32 may be coated with a suitable release agent coating to facilitate its removal from the deformable material 30 after the curing, hardening or solidification thereof.

The deformable material 30 may be any suitable well known organic type, such as monomers, monomer mixtures, oligomers, and oligomer mixtures that are solidified through curing. Alternately, the deformable material 30 may be any suitable type epoxy resin which may be cured using an acid catalyst.

The object 32 is kept through the application of suitable pressure thereto, or application of pressure to the wafer substrate 20, or the application of pressure to both the object 32 and the wafer substrate 20 in engagement with the deformable material 30 until such material has hardened or solidified to form a permanently flat, planar surface 36 thereon being the mirror image of the flat, planar surface 34 on the object 32. At such time, the object 32 is removed from engagement with the deformable material 30.

Figure 2:
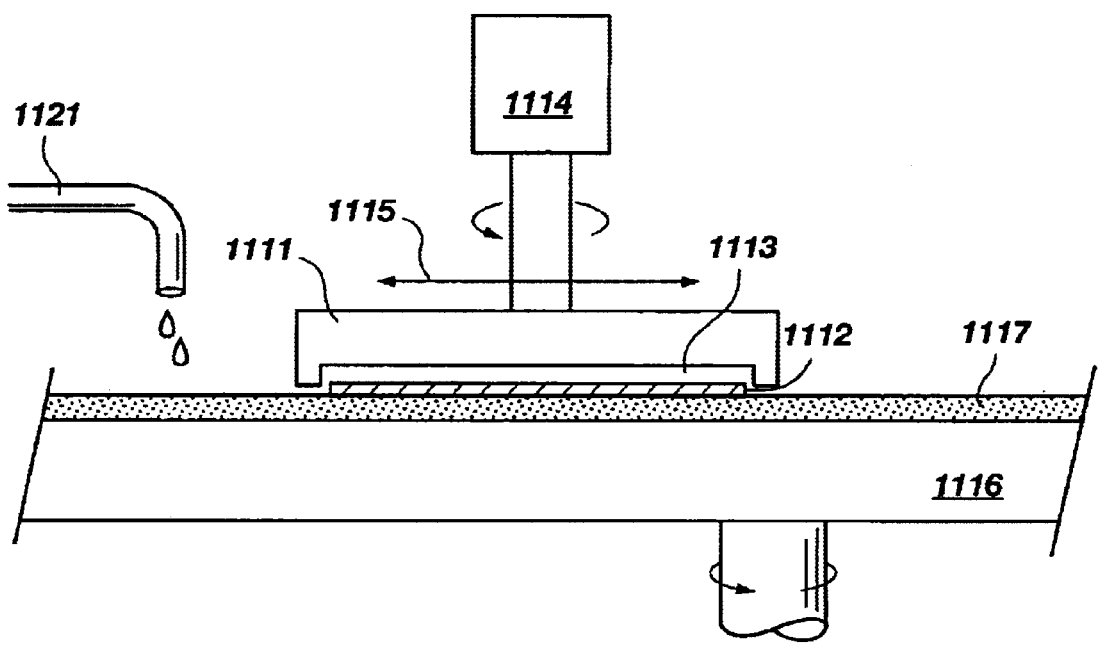
FIG. 2 is an illustration of a conventional rotational chemical mechanical planarization apparatus.
Figure 3:
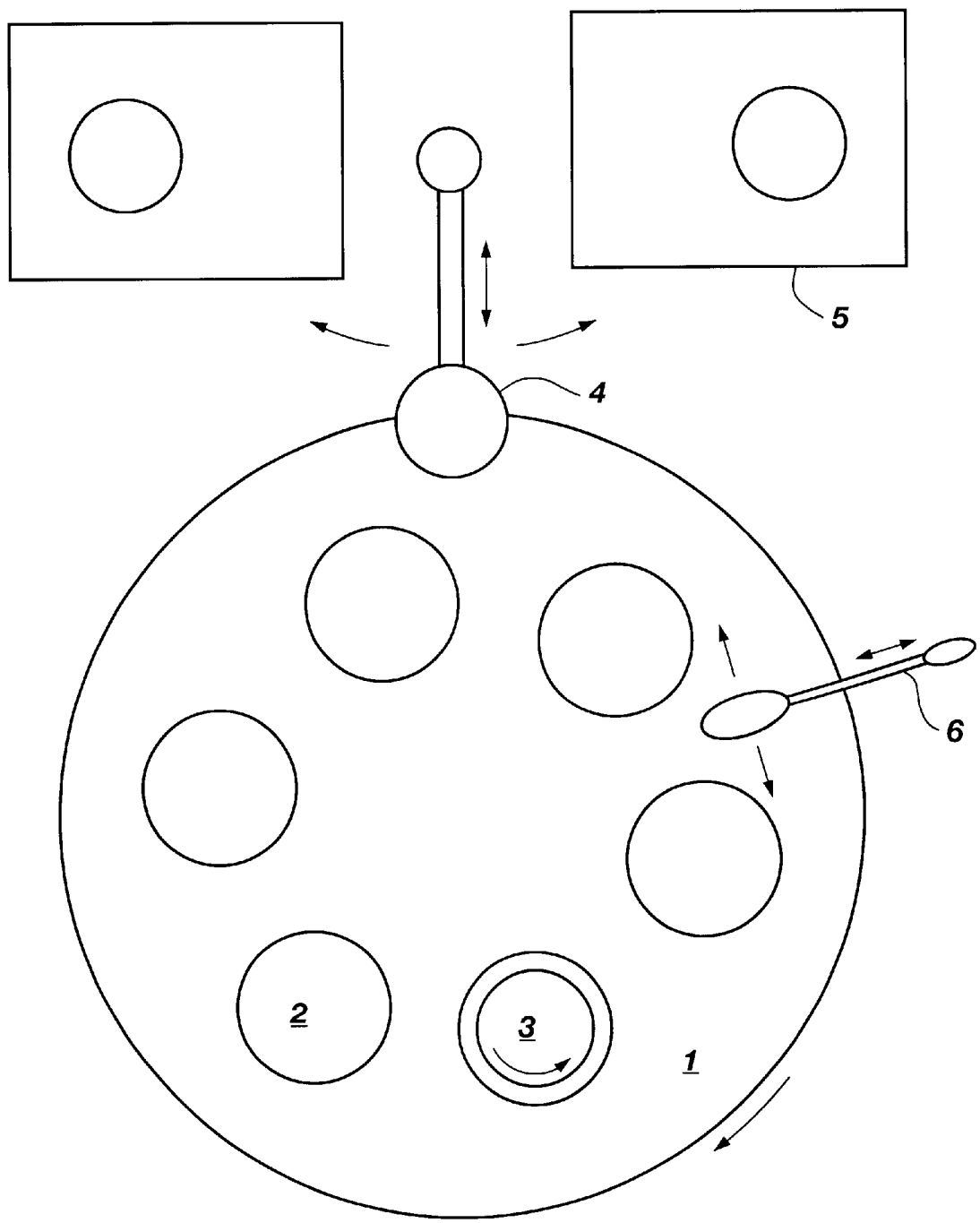
FIG. 3 is an illustration of a top view of a polishing table of a conventional rotational chemical mechanical planarization apparatus.
Figure 6:
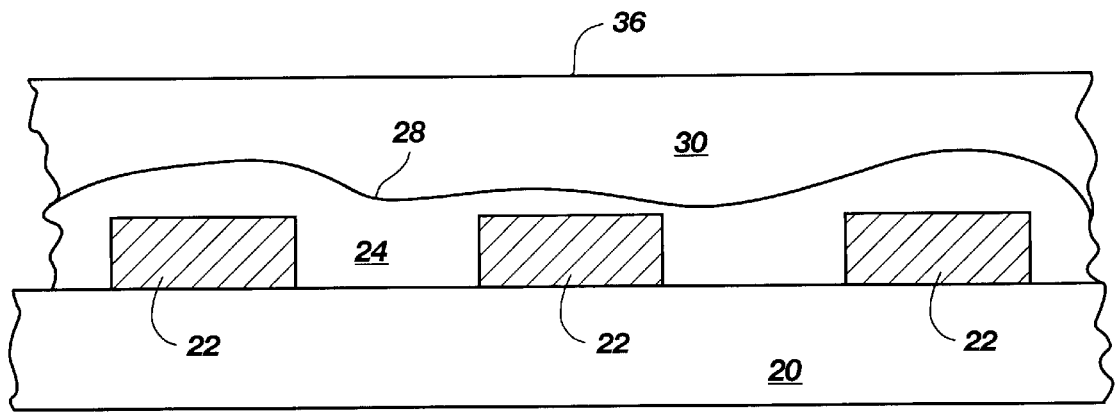
FIG. 6 is a cross-sectional view of a portion of a wafer substrate having electrical circuit components formed thereon, a coating thereover, and a deformable coating after the deformation thereof using a flat pressing member in the process of the present invention.

Referring to drawing FIG. 6, before the chemical mechanical planarization process of the present invention commenced the wafer substrate 20 having electrical circuit components 22 and insulative material 24 thereon is illustrated having the deformable material 30 having a flat, planar surface 36 thereon providing a global flat, planar surface on the wafer substrate. As illustrated, the flat, planar surface 36 on the deformable material 30 is a flat, planar surface from which the chemical mechanical planarization process is to begin on the wafer substrate 20. In this manner, a conventional, well known chemical mechanical planarization process as described hereinbefore can be used to form flat planar surfaces on the insulating material 24. By starting with a globally flat, planar surface 36 on the deformable material 30, any deformation of the pad 1117 (FIG. 2) is minimized. Also, any nonuniform planarization which may occur due to the uneven distribution of the chemical reactive solution and abrasives included therein or material particles from the surfaces being planarized being collected or present in the polishing pad 1117 resulting from surface irregularities is minimized. In this manner, by starting the chemical mechanical planarization process from a globally flat, planar surface 36 of the deformable material 30, as the chemical mechanical planarization process is carried out, the surfaces of the layers being planarized remain flat and planar because the polishing pad 1117 is subjected to more uniform loading and operation during the process. This is in clear contrast to the use of a chemical mechanical planarization process beginning from an irregular nonplanar surface as is typically carried out in the prior art.

Figure 7:
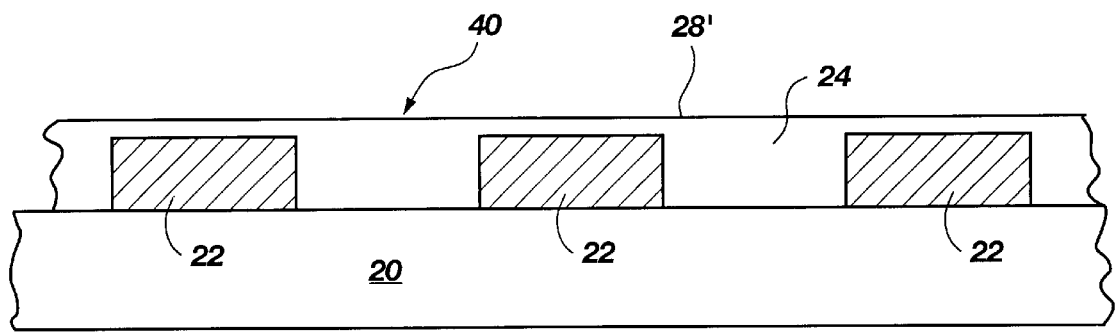
FIG. 7 is a cross-sectional view of a portion of a wafer substrate having electrical circuit components formed thereon and a coating material between the electrical circuit components after the chemical mechanical planarization process of the present invention of the configuration illustrated in drawing FIG. 6.

Referring to drawing FIG. 7, illustrated is a wafer substrate 20, electrical circuit components 22 and insulating material 24 which have been planarized using the improved chemical mechanical planarization process of the present invention. As illustrated, a flat, planar surface 40 has been formed through the use of the chemical mechanical planarization process of the present invention as described hereinbefore with the flat, planar surface 40 including flat planar surface 28' of the insulating material 24.

Figure 8:
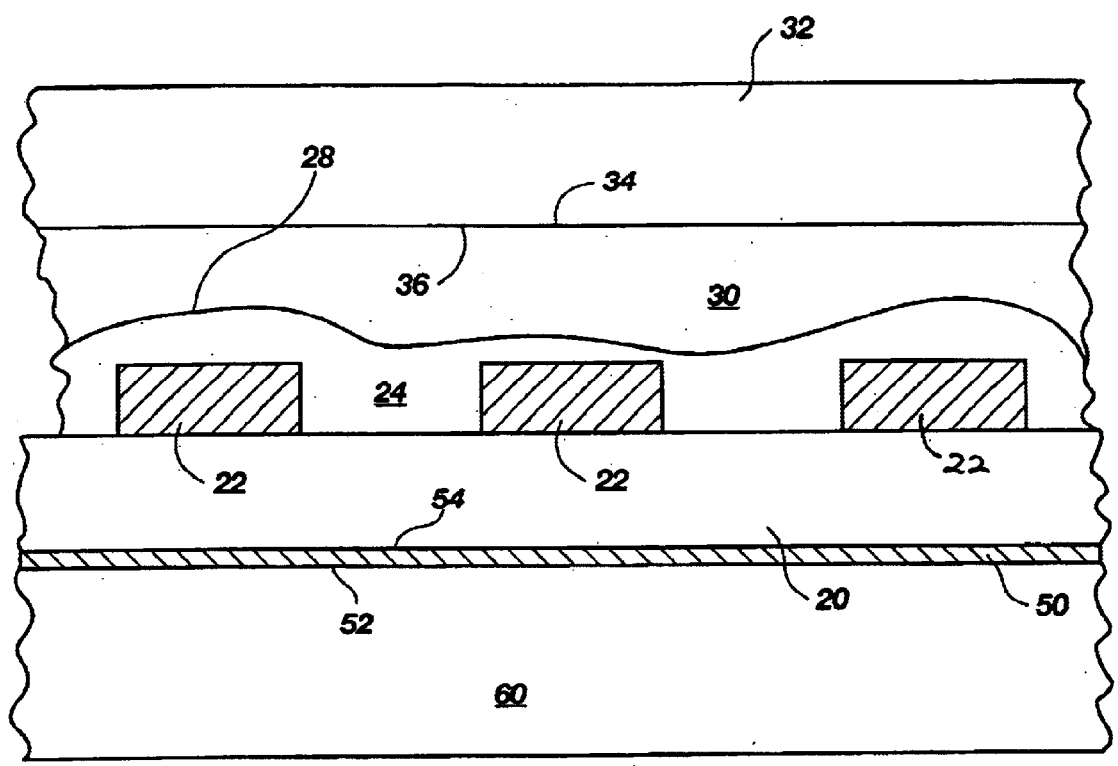
FIG. 8 is a cross-sectional view of a portion of a wafer substrate, a resilient member located below the wafer substrate, a support member located below the resilient member and electrical circuit components formed on the wafer substrate, a coating located over the electrical circuits, and a deformable coating located over the coating formed over the electrical circuits after the deformation thereof using a flat pressing member in the process of the present invention.

Referring to drawing FIG. 8, an alternate apparatus and method of the improved chemical mechanical planarization process of the present invention is illustrated. The present invention is illustrated in relation to a wafer substrate 20 having electrical circuit components 22 thereon and a coating of insulating material 24 thereover. In the improved chemical mechanical planarization process of the present invention, prior to the initiation of the chemical mechanical planarization of the wafer substrate 20, electrical circuit components 22 and insulating material 24, a layer of deformable material 30 is coated or deposited over the insulating material 24. The deformable material 30 may be of any suitable type material which readily flows over the nonplanar surface 28 of the insulating material 24 that is subsequently solidified through curing or hardening. The deformable material 30 is applied over the insulating material 24 to any desired depth but is typically applied in a thickness greater than the surface typography of the wafer, the thickness of the deformable material 30 initially applied to the wafer depending upon the type of material selected for such use, the dimensions of the surface irregularities, etc.

Figure 1:
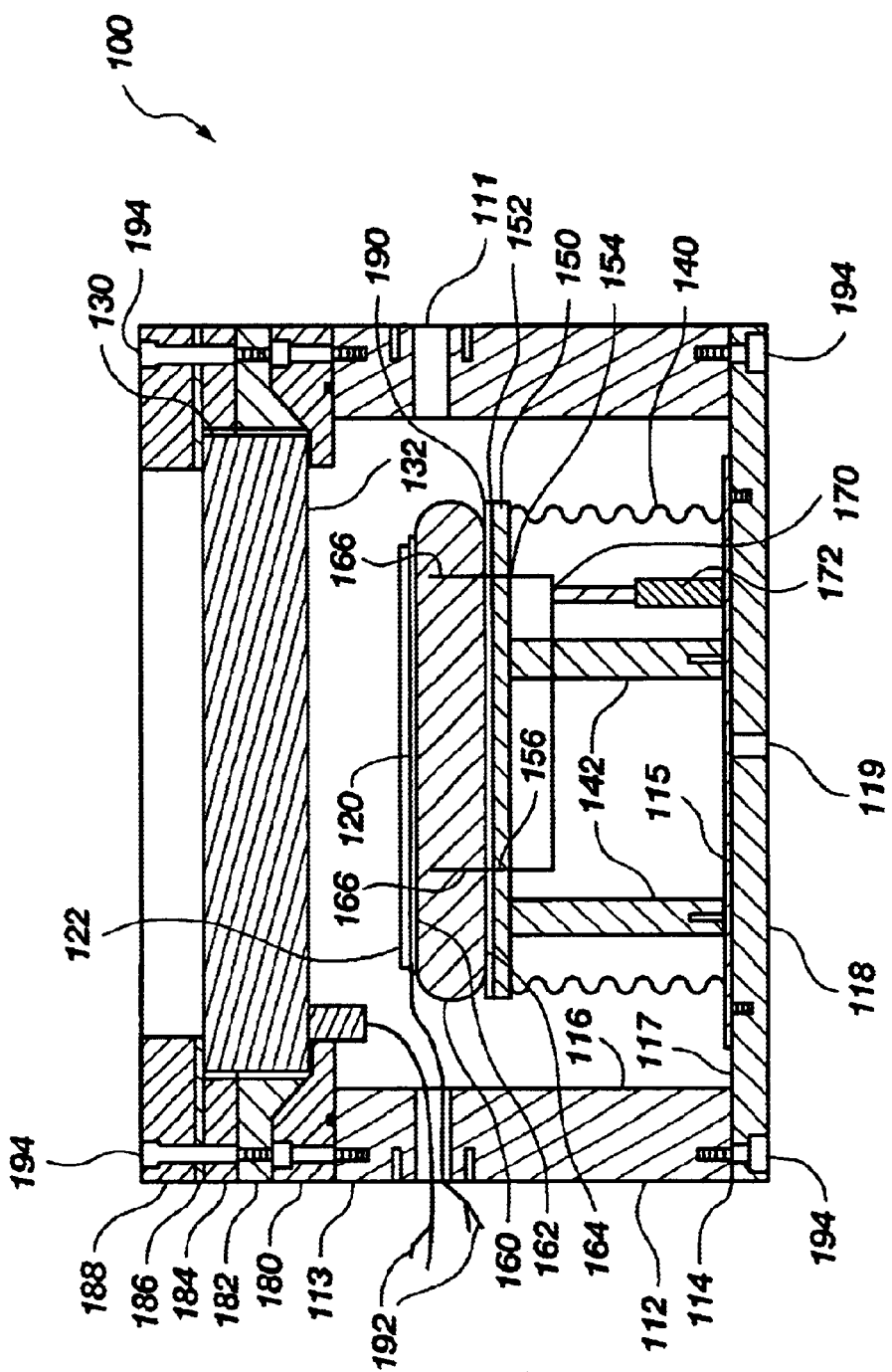
FIG. 1 is a side view of a global planarization apparatus.

After the application of the layer of deformable material 30 to the insulating material 24 and before the deformable material 30 has cured, hardened, or solidified to the point which it is not capable of being deformed, a flexible resilient member 50 is placed under the wafer substrate 20 between the wafer substrate 20 and the substrate 60 on which the wafer substrate 20 is supported and an object 32 having a flat planar surface 34 thereon is forced under pressure into flat, planar surface 36 of the deformable material 30 to form a globally flat, planar surface 36 thereon and is kept in contact with the deformable material 30 while the deformable material 30 cures, hardens, or solidifies. As previously illustrated, the object 32 may be of any well known suitable material, such as an optical quartz glass disc shaped object having a flat, planar ground surface thereon which may be used to be pressed into the deformable material 30 to form a globally flat, planar surface 36 thereon. If desired, the object 32 may be tailored to meet process requirements of the desired range of pressure to be applied to the deformable material 30 and the method of curing, hardening or solidifying the deformable material 30. Further, if desired, the flat, planar surface 34 of the object 32 may have a shape other than a flat, planar surface 34, such as either a concave surface, convex surface, or any desired surface. Additionally, the flat, planar surface 34 of the object 32 may be coated with a suitable release agent coating to facilitate its removal from the deformable material 30 after the curing, hardening or solidification thereof The flexible resilient member 50 comprises a suitably shaped member compatible with the wafer substrate 20 formed of resilient material which will deform under an applied force to uniformly distribute the applied force from the object 32 to the deformable material 30, even if the flat, planar surface 34 of object 32, surfaces 52 and 54 of the flexible resilient member 50 and the flat, planar surface 36 of the deformable material 30 on wafer substrate 20 are not substantially parallel to each other or, alternately, when thickness variations locally exist within either the wafer substrate 20, electrical circuit components 22, insulating material 24, object 32, and/or flexible resilient member 50. It is preferred that the flexible resilient member 50 is thermally stable and resistant to the temperature ranges of operation experienced during the pressing by object 32 and that the flexible resilient member 50 be formed from a low viscosity and low durometer hardness material. In this manner, the flexible resilient member 50 serves to compensate for the variations in the thickness of the wafer substrate 20, electrical circuit components 22, insulating material 24, deformable material 30, and object 32 as well as compensating for any nonparallel surfaces on the object 32 or the wafer substrate 20 or the substrate 60 on which the wafer substrate 20 is supported during the pressing of object 32 to form flat, planar surface 36 on the deformable material 30 prior to the beginning of the chemical mechanical planarization process thereafter. The preferable manner in which the insulating material 24 on a wafer substrate 20 is to be globally planarized to have a globally flat, planar surface 28' to begin the chemical mechanical planarization process is to use the global planarization apparatus 100 hereinbefore described with respect to drawing FIG. 1, or its equivalent.

Figure 9A:
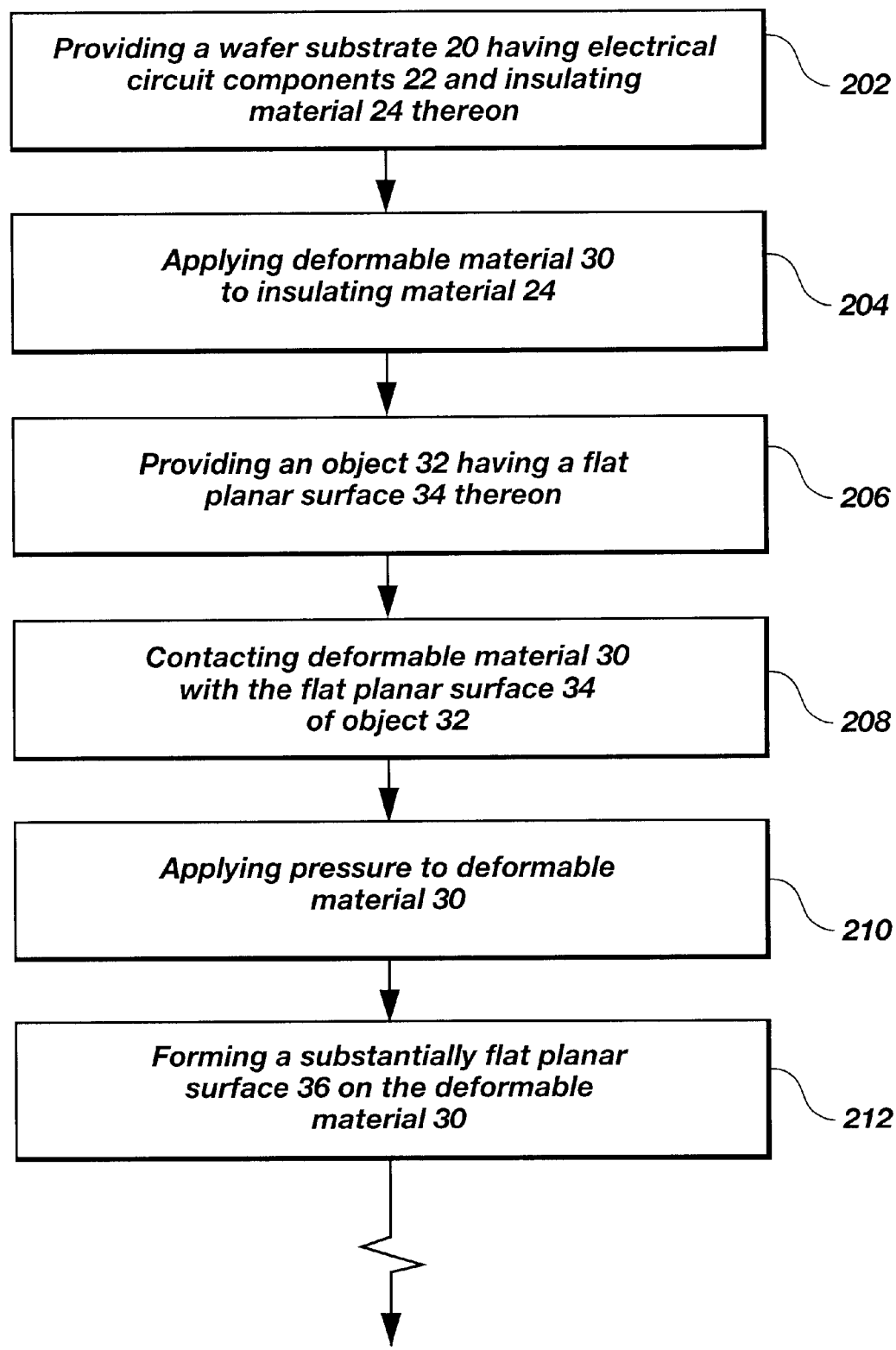
FIGS. 9A and 9B are a process flow description of the improved chemical mechanical planarization process of the present invention as illustrated in FIG. 7.
Figure 9B:
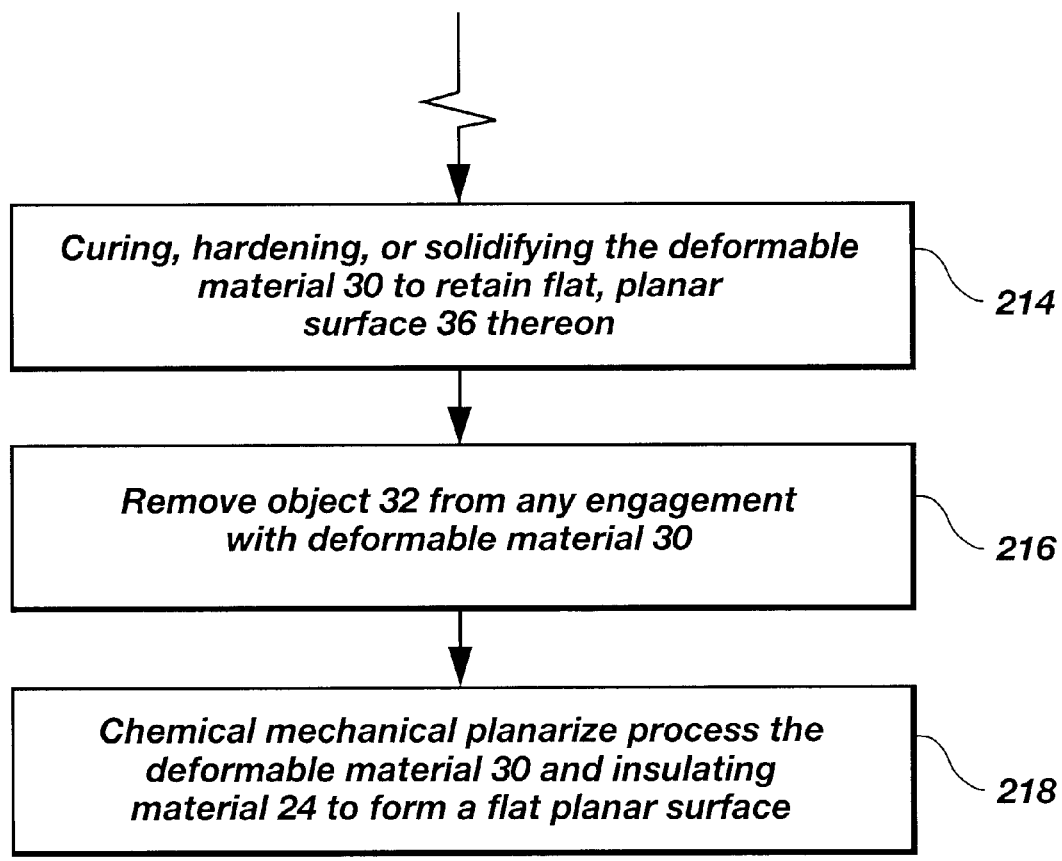

Referring to drawing FIGS. 9A and 9B, the improved chemical mechanical planarization process of the present invention as described hereinbefore is illustrated in a series of process steps 202 through 218.

In process step 202, a wafer substrate 20 is provided having electrical circuitry components 22 formed thereon and an insulating material coating 24 covering the electrical circuitry components 22 and portions of the wafer substrate 20.

In process step 204, a coating of deformable material 30 which is uncured, unhardened, or not solidified at the time of application is applied to the coating of insulating material 24 to cover the same.

Next, in process step 206, an object 32 having a flat planar surface 34 thereon is provided for use.

In process step 208, the surface of deformable material 30 is contacted by the flat, planar surface 34 of the object 32.

In process step 210, a predetermined level of pressure is applied at a predetermined temperature level to the deformable material 30. The pressure may be applied to either the object 32, the wafer substrate 20, or both, etc.

In process step 212, flat, planar surface 34 of object 32 forms a flat, planar surface 36 on the deformable material 30.

In process step 214, while the flat, planar surface 34 of the object 32 engages the deformable material 30 thereby forming the flat, planar surface 36 thereon, the deformable material 30 is cured, hardened, or solidified to cause the permanent formation and retention of the flat, planar surface 36 on the deformable material 30.

In process step 216, the object 32 is removed from engagement with the deformable material 30 after the curing, hardening or solidification thereof to retain the flat, planar surface 36 thereon.

In process step 218, the wafer substrate 20 having electrical circuit components 22, insulating material 24, and cured, hardened, or solidified deformable material 30 thereon is subjected to a suitable chemical mechanical planarization process until the upper surfaces 26 of the electrical circuit components and flat, planar surface 28' of the insulating material 24 are a concurrent common flat, planar surface extending across the wafer substrate 20 (see FIG. 7).

Figure 10A:
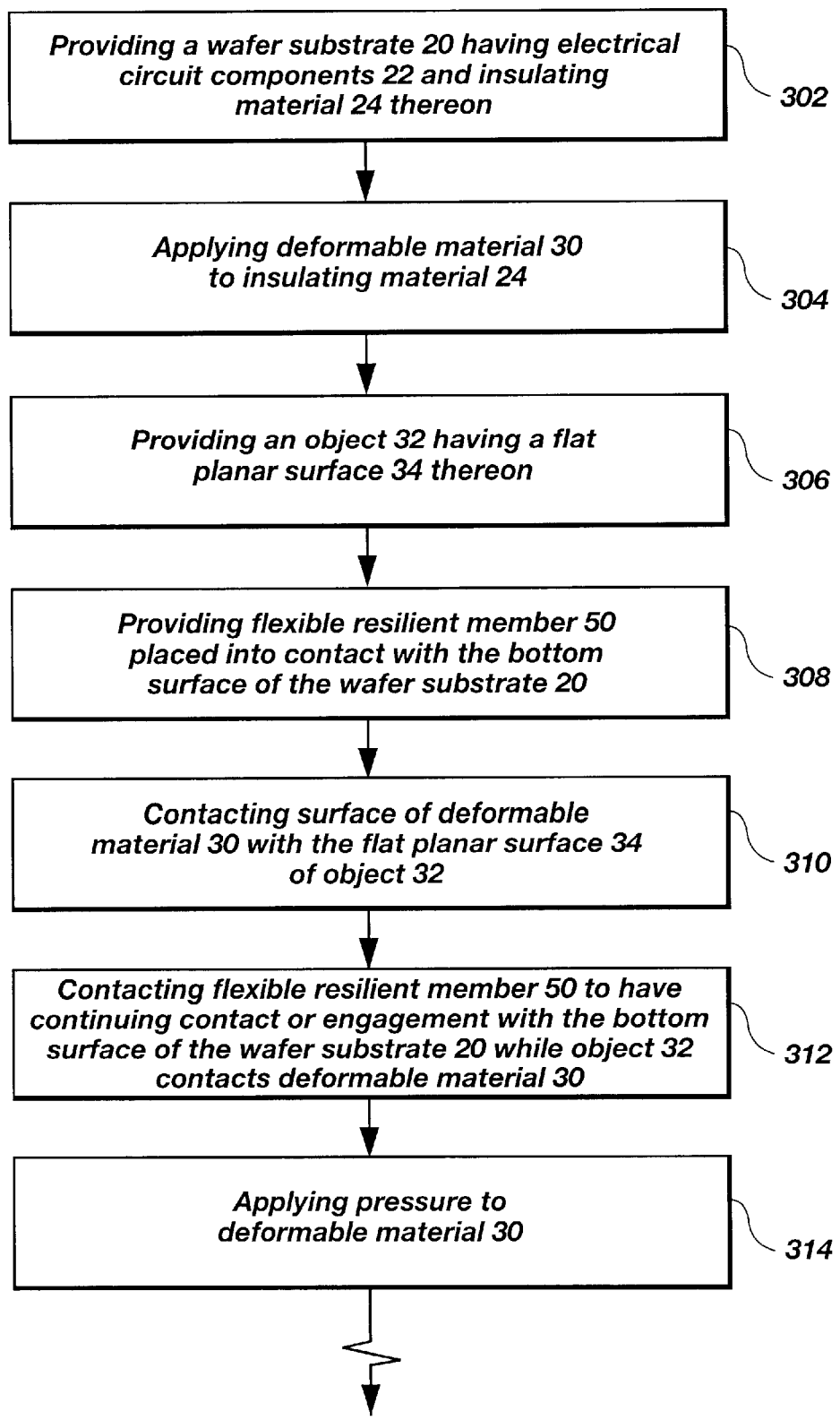
FIGS. 10A and 10B are a process flow description of the improved chemical mechanical planarization process of the alternative embodiment of the present invention illustrated in drawing FIG. 8.
Figure 10B:
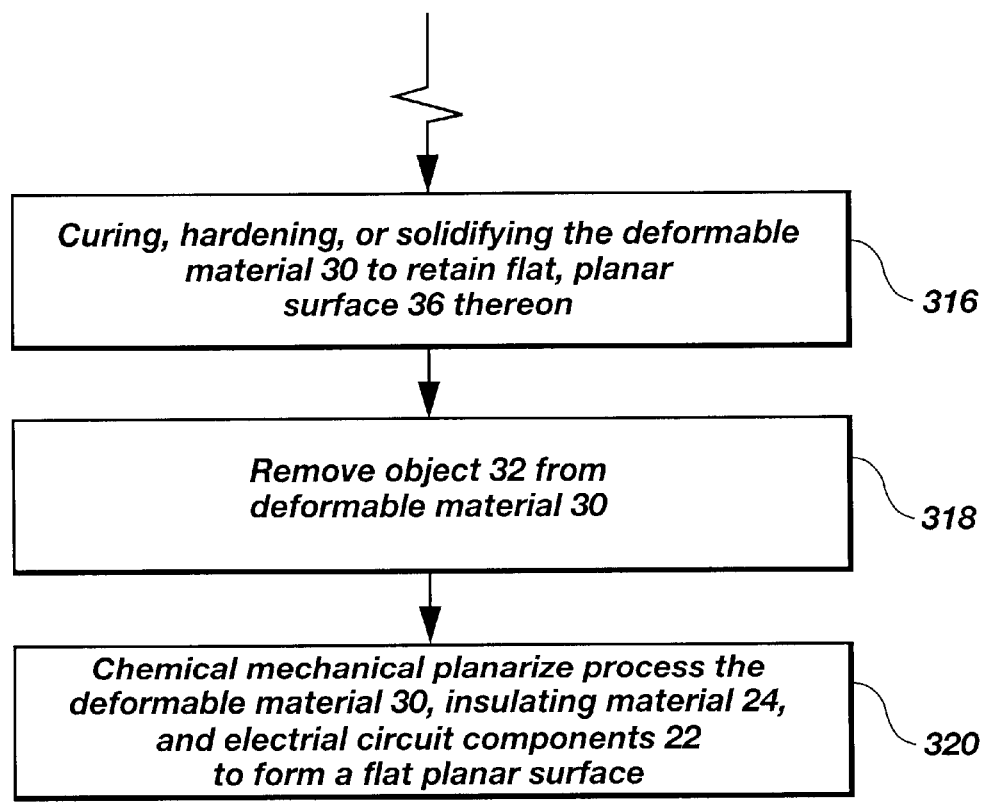

Referring to drawing FIGS. 10A and 10B, alternately, if the apparatus and method described with respect to drawing FIG. 8 are used, the process of such improved chemical mechanical planarization process is illustrated in process steps 302 through 320.

In process step 302, a wafer substrate 20 is provided having electrical circuitry components 22 formed thereon and an insulating material 24 covering the electrical circuit components 22 and portions of the wafer substrate 20.

In process step 304, a coating of deformable material 30 which is uncured, unhardened, or not solidified at the time of application is applied to the coating of insulating material 24 to cover the same.

Next, in process step 306, an object 32 having a flat planar surface 34 thereon is provided for use.

In process step 308, a flexible resilient member 50 is placed in contact with the bottom surface of the wafer substrate 20.

In process step 310, the flat, planar surface 36 of the deformable material 30 is contacted with the flat, planar surface 34 of the object 32.

In process step 312, flexible resilient member 50 remains contacting or engaging the bottom surface of the wafer substrate 20.

In process step 314, a predetermined level of pressure is applied at a predetermined temperature level to either the object 32, or the wafer substrate 20, or both, thereby causing the flat, planar surface 34 of the object 32 to transmit force to the deformable material 30, thereby causing the flat, planar surface 36 of the deformable material 30 to form a flat planar surface 36 thereon substantially similar to the flat planar surface 34 of the object 32.

In process step 316, while the flat, planar surface 34 of the object 32 engages the deformable material 30, thereby forming the flat, planar surface 36 thereon, the deformable material 30 is cured, hardened or solidified to cause the permanent formation and retention of the flat, planar surface 36 on the deformable material 30.

In process step 318, the object 32 is removed from engagement with the deformable material 30 after the curing, hardening or solidification thereof to retain the flat, planar surface 36 thereon. If the flexible resilient member 50 is used on the bottom of the wafer substrate 20, it may remain, or, if desired, a comparable flexible member may be provided during the chemical mechanical planarization process.

In process step 320, the wafer substrate 20 having electrical circuit components 22, insulating material 24, and cured, hardened, or solidified deformable coating 30 thereon is subjected to a suitable chemical mechanical planarization process until the upper surfaces 26 of the electrical circuit components and flat, planar surface 28' of the insulating material 24 are a concurrent, common, unbroken flat, planar surface 40 extending across the wafer substrate 20 (see FIG. 7). The preferable manner in which the insulating material 24 on a wafer substrate 20 is to be globally planarized to have a globally flat, planar surface 28 to begin the chemical mechanical planarization process is to use the global planarization apparatus 100 hereinbefore described with respect to drawing FIG. 1, or its equivalent.

In this manner, when the improved process of chemical mechanical planarization of the present invention is used, the resulting planarized surface on the wafer substrate is globally planar or more planar since the process started from a globally flat, planar surface and the chemical mechanical planarization process reaches a successful conclusion more quickly because the surface being planarized does not deform the polishing pad unnecessarily as the surface remains substantially planar throughout the process. This is in clear contrast to the prior art conventional chemical mechanical planarization process which begins from an irregular nonplanar surface, thereby causing the deformation and deflection of the polishing pad, thereby, in turn, causing an irregular nonplanar surface in the surface being planarized. Furthermore, the improved chemical mechanical planarization process of the present invention offers advantages over a globally planarized surface which is subsequently dry resistant etched-back. In globally planarized surfaces which are dry etched-back, the dry etching process does not act uniformly on the materials being etched as they are subjected to the etching process at differing times and each material exhibits a differing etching rate, thereby causing irregularities to be present in the resulting final surface at the end of the dry etching process. In contrast, the improved chemical mechanical planarization process begins from a globally flat planar surface, retains a globally flat, planar surface throughout the process, and results in a final globally flat planar surface at the end of the process.

It will be understood that changes, additions, modifications, and deletions may be made to the improved chemical mechanical planarization process of the present invention which are clearly within the scope of the claimed invention.

What is claimed is:

1. A planarization method for planarizing a surface of a wafer comprising:
   providing a wafer having a surface;
   coating the surface of the wafer using a deformable material;
   contacting the deformable material with an object;
   forming a substantially flat planar surface on the deformable material on the surface of the wafer;
   hardening the deformable material while the object contacts the deformable material; and
   planarizing the wafer using a chemical mechanical planarization process.

2. A planarization method for planarizing a surface of a wafer comprising:
   providing the wafer having a surface;
   coating the surface of the wafer using a deformable material;
   contacting the deformable material with an object;
   forming a substantially flat planar surface the deformable material on the surface of the wafer;
   solidifying the deformable material while the object contacts the deformable material; and
   planarizing the wafer using a chemical mechanical planarization process.

3. A planarization method for planarizing a surface of a wafer comprising:
   providing a wafer having a surface;
   coating the surface of the wafer using a deformable material;
   contacting the deformable material with an object;
   forming a substantially flat planar surface on the deformable material on the surface of the wafer;
   performing one of a group of curing, hardening, and solidifying the deformable material while the object is contacting the deformable material; and
   planarizing the wafer using a chemical mechanical planarization process.

4. The method of claim 3, further comprising:
   applying pressure to the object contacting the deformable material while the object contacts the deformable material.

5. The method of claim 3, further comprising:
   applying pressure to the deformable material on the surface of the wafer while the object contacts the deformable material.

6. The method of claim 3, wherein the object includes a substantially flat planar surface thereon contacting the deformable material.

7. The method of claim 3, wherein the object comprises a substantially inflexible object having a flat surface thereon.

8. The method of claim 3, further comprising:
   contacting the wafer with a flexible resilient member.

9. The method of claim 8, wherein a back of the wafer is contacted with the flexible resilient member.

10. The method of claim 8, further comprising:
    applying pressure to the flexible resilient member to form a substantially flat planar surface on the deformable material.

11. The method of claim 10, further comprising:
    contacting the flexible resilient member with a substrate; and
    applying pressure to the substrate for applying pressure to the flexible resilient member.

12. The method of claim 10, further comprising:
    applying pressure to the wafer through the flexible resilient member for applying pressure to the object for deforming the deformable material on the wafer.

13. The method of claim 3, wherein the wafer comprises a wafer having electrical circuit components on a surface thereof.

14. The method of claim 3, wherein the wafer comprises a wafer having a plurality of electrical circuit components on a surface thereof and a coating substantially covering the plurality of electrical circuit components.

15. The method of claim 3, wherein the wafer comprises a wafer having a plurality of electrical components on a surface thereof and a coating substantially covering the plurality of electrical components and the wafer.

16. The method of claim 3, further comprising:
    applying a substantially uniform pressure to the object while the object is in contact with the deformable material.

17. The method of claim 3 further comprising:
    applying a substantially uniform pressure to the deformable material on the surface of the wafer for forming a substantially flat planar surface on the deformable material.

18. A planarization method for planarizing a surface of a wafer comprising:
    providing a wafer having a surface;
    coating the surface of the wafer using a deformable material;
    contacting the deformable material with an object, the object including a shaped surface thereon contacting the deformable material, the shaped surface including a convex surface portion;
    forming a substantially flat planar surface on the surface of the wafer; and
    planarizing the wafer using a chemical mechanical planarization process.

19. A planarization method for planarizing a surface of a wafer comprising:
    providing a wafer having a surface;
    coating the surface of the wafer using a deformable material;
    contacting the deformable material with an object, the object including a shaped surface thereon contacting the deformable material, the shaped surface including a concave surface portion;
    forming a substantially flat planar surface on the surface of the wafer; and
    planarizing the wafer using a chemical mechanical planarization process.

20. A planarization method for planarizing a surface of a wafer comprising:
    providing the wafer having a surface;
    coating the surface of the wafer using a deformable material;
    contacting the deformable material with an object, the object including a shaped surface thereon contacting the deformable material, the shaped surface including a convex surface portion and a concave surface portion;

forming a substantially flat planar surface on the shaped surface of the wafer; and planarizing the wafer using a chemical mechanical planarization process.

21. A planarization method for planarizing a surface of a wafer comprising:

providing the wafer having a surface;

coating the surface of the wafer using a deformable material;

contacting the deformable material with an object, the object including a shaped surface thereon contacting the deformable material, the object including a flat optical glass object;

forming a substantially flat planar surface on the surface of the wafer; and planarizing the wafer using a chemical mechanical planarization process.

22. A planarization method for planarizing a surface of a wafer comprising:

providing the wafer having a surface;

coating the surface of the wafer using a deformable material;

contacting the deformable material with an object, the object including a shaped surface thereon contacting the deformable material;

coating the object with a release agent prior to the contacting the deformable material;

forming a substantially flat planar surface on the surface of the wafer; and planarizing the wafer using a chemical mechanical planarization process.

23. A planarization method for planarizing a surface of a wafer having at least one electrical circuit formed thereon comprising:

providing the wafer having a surface thereon;

coating the surface of the wafer using a deformable material;

contacting the deformable material with an object;

forming a substantially flat planar surface on the surface of the wafer;

curing the deformable material while the object contacts the deformable material; and planarizing the substantially flat planar surface on the wafer using a chemical mechanical planarization process.

24. A planarization method for planarizing a surface of a wafer having at least one electrical circuit formed thereon comprising:

providing the wafer having a surface;

coating the surface of the wafer using a deformable material;

contacting the deformable material with an object;

forming a substantially flat planar surface on the surface of the wafer;

hardening the deformable material while the object contacts the deformable material; and planarizing the substantially flat planar surface on the wafer using a chemical mechanical planarization process.

25. A planarization method for planarizing a surface of a wafer having at least one electrical circuit formed thereon comprising:

providing said wafer having a surface;

coating the surface of the wafer using a deformable material;

contacting the deformable material with an object;

forming a substantially flat planar surface on the surface of the wafer;

solidifying the deformable material while the object contacts the deformable material; and planarizing the substantially flat planar surface on the wafer using a chemical mechanical planarization process.

26. The method of claim 25, further comprising:

applying pressure to the object contacting the deformable material while the object contacts the deformable material.

27. The method of claim 25, further comprising:

applying pressure to the deformable material on the surface of the wafer while the object contacts the deformable material.

28. The method of claim 25, wherein the object includes a substantially flat planar surface thereon for contacting the deformable material.

29. The method of claim 25, wherein the object includes a shaped surface thereon for contacting the deformable material.

30. A planarization method for planarizing a surface of a wafer having at least one electrical circuit formed thereon comprising:

providing the wafer having a surface;

coating the surface of the wafer using a deformable material;

contacting the deformable material with an object, the object including a shaped surface thereon for contacting the deformable material, the shaped surface including a convex surface portion;

forming a substantially flat planar surface on the surface of the wafer; and planarizing the substantially flat planar surface on the wafer using a chemical mechanical planarization process.

31. A planarization method for planarizing a surface of a wafer having at least one electrical circuit formed thereon comprising:

providing the wafer having a surface;

coating the surface of the wafer using a deformable material;

contacting the deformable material with an object, the object including a shaped surface thereon contacting the deformable material, the shaped surface including a concave surface portion;

forming a substantially flat planar surface on the surface of the wafer; and planarizing the substantially flat planar surface on the wafer using a chemical mechanical planarization process.

32. A planarization method for planarizing a surface of a wafer having at least one electrical circuit formed thereon comprising:

providing the wafer having a surface;

coating the surface of the wafer using a deformable material;

contacting the deformable material with an object, the object including a shaped surface thereon contacting the deformable material, the shaped surface including a convex surface portion and a concave surface portion;

forming a substantially flat planar surface on the surface of the wafer; and planarizing the substantially flat planar surface on the wafer using a chemical mechanical planarization process.

33. The method of claim 32, wherein the shaped surface comprises a desired shaped surface.

34. A planarization method for planarizing a film on a surface of a wafer having at least one electrical circuit formed thereon comprising:

providing the wafer having a surface;

coating the surface of the wafer using a deformable material;

contacting the deformable material with an object, the object including a flat optical glass object;

forming a substantially flat planar surface on the surface of the wafer; and planarizing the substantially flat planar surface on the wafer using a chemical mechanical planarization process.

35. A planarization method for planarizing a surface of a wafer having at least one electrical circuit formed thereon comprising:

providing the wafer having a surface;

providing an object;

coating the surface of the wafer with a deformable material;

coating the object with a release agent;

contacting the deformable material with the object;

forming a substantially flat planar surface on the surface of the wafer; and planarizing the substantially flat planar surface on the wafer using a chemical mechanical planarization process.

36. A planarization method for planarizing a nonplanar film surface of a wafer comprising:

providing an object having a flat surface thereon;

applying a deformable material to the nonplanar film surface of the wafer;

contacting the deformable material with the object;

forming a substantially flat planar surface on the deformable material on the surface of said wafer; and planarizing the wafer using a chemical mechanical planarization process.

37. A planarization method for planarizing a nonplanar film surface of a wafer, the method comprising:

providing an object having a flat planar surface thereon;

providing a flexible resilient member at a back of the wafer;

applying a deformable material to the nonplanar film surface of the wafer;

contacting the deformable material;

forming a substantially flat planar surface on the deformable material on the nonplanar film surface of the wafer; and planarizing the wafer using a chemical mechanical planarization process.

38. The method of claim 37, wherein the deformable material is contacted by the object.

39. A planarization method for planarizing a nonplanar surface of a wafer comprising:

providing an object having a flat planar surface thereon;

applying a deformable material to the nonplanar surface of the wafer;

contacting the deformable material with the object;

forming a substantially flat planar surface on the deformable material on the nonplanar surface of the wafer; and planarizing the wafer using a chemical mechanical planarization process.

40. A planarization method for planarizing a nonplanar surface of a wafer comprising:

providing an object having a flat planar surface thereon;

providing a flexible resilient member to at least a portion of the wafer;

applying a deformable material to the nonplanar surface of the wafer;

contacting the deformable material with the object;

forming a substantially flat planar surface on the deformable material on the nonplanar surface of the wafer; and planarizing the wafer using a chemical mechanical planarization process.

41. A planarization method for planarizing a nonplanar surface of a wafer comprising:

providing an object having a flat planar surface thereon;

providing a flexible resilient member;

applying a deformable material to the nonplanar surface of the wafer;

contacting another surface of the wafer with the flexible resilient member;

applying pressure to the deformable material with the object;

forming a substantially flat planar surface on the deformable material on said nonplanar surface of the wafer; and planarizing the wafer using a chemical mechanical planarization process.

42. A planarization method for planarizing a nonplanar surface of a wafer comprising:

providing an object having a flat planar surface thereon;

providing a flexible resilient member on at least a portion of another surface of the wafer;

applying a deformable material to the nonplanar surface of the wafer;

contacting the deformable material;

forming a substantially flat planar surface on the deformable material on the nonplanar surface of the wafer; and planarizing the substantially flat planar surface on the deformable material on the nonplanar surface of the wafer using a chemical mechanical planarization process.

43. A planarization method for planarizing a nonplanar surface of a wafer comprising:

providing an object having a flat planar surface thereon;

providing a flexible resilient member;

applying a deformable material to the nonplanar surface of the wafer;

contacting at least a portion of another surface of the wafer with the flexible resilient member;

applying pressure to the deformable material;

forming a substantially flat planar surface on the deformable material on the nonplanar surface of the wafer; and planarizing the substantially flat planar surface on the deformable material on the nonplanar surface of the wafer using a chemical mechanical planarization process.

44. A planarization method for planarizing a nonplanar film surface of a wafer comprising:
  coating the nonplanar film surface of the wafer using a deformable material;
  contacting the deformable material with an object;
  forming a substantially flat planar surface on the nonplanar film surface of the wafer;
  performing one of a group of curing, hardening, and solidifying the deformable material while the object is contacting the deformable material; and
  planarizing the wafer using a chemical mechanical planarization process.

45. A planarization method for planarizing a nonplanar surface of a wafer having at least one electrical circuit formed thereon comprising:
  coating the nonplanar surface of the wafer using a deformable material;
  contacting the deformable material with an object;
  forming a substantially flat planar surface on the nonplanar surface of the wafer by performing one of a group of curing, hardening, and solidifying the deformable material while the object contacts the deformable material; and
  planarizing the substantially flat planar surface on the wafer using a chemical mechanical planarization process.

* * * * *